(12) United States Patent
Kang et al.

(10) Patent No.: US 11,189,630 B2
(45) Date of Patent: Nov. 30, 2021

(54) MEMORY DEVICE AND ELECTRONIC DEVICE INCLUDING INSULATING PATTERNS WITH DIFFERENT THERMAL CONDUCTIVITIES

(71) Applicant: SK hynix Inc., Icheon (KR)

(72) Inventors: Dae Gun Kang, Icheon (KR); Hyun Seok Kang, Seoul (KR); Deok Lae Ahn, Hanam (KR); Jae Geun Oh, Seoul (KR); Won Ki Joo, Icheon (KR); Su-Jin Chae, Icheon (KR)

(73) Assignee: SK hynix Inc., Icheon (KR)

( * ) Notice: Subject to any disclaimer, the term of this patent is extended or adjusted under 35 U.S.C. 154(b) by 22 days.

(21) Appl. No.: 16/552,679

(22) Filed: Aug. 27, 2019

(65) Prior Publication Data
US 2020/0203361 A1    Jun. 25, 2020

(30) Foreign Application Priority Data
Dec. 19, 2018    (KR) .................. 10-2018-0165557

(51) Int. Cl.
*H01L 27/11575* (2017.01)
*H01L 23/522* (2006.01)
*H01L 27/11565* (2017.01)
*H01L 27/11578* (2017.01)
*G11C 13/00* (2006.01)
*H01L 27/11519* (2017.01)

(52) U.S. Cl.
CPC .... *H01L 27/11575* (2013.01); *H01L 23/5221* (2013.01); *H01L 23/5226* (2013.01); *H01L 27/11565* (2013.01); *H01L 27/11578* (2013.01); *G11C 13/0097* (2013.01); *H01L 27/11519* (2013.01)

(58) Field of Classification Search
CPC ......... H01L 27/11575; H01L 27/11565; H01L 27/249; H01L 23/5221; H01L 45/04; H01L 27/2409; H01L 27/11578; H01L 27/11519; H01L 27/2463; H01L 27/2427; H01L 27/222; H01L 23/5226; H01L 45/12; H01L 45/144; H01L 45/147; G11C 7/04; G11C 13/0097; G11C 13/003; G11C 2213/50; G11C 2213/71
USPC ........................................................ 257/324
See application file for complete search history.

(56) References Cited

U.S. PATENT DOCUMENTS 8,208,279 B2 *   6/2012   Lue ..................... H01L 27/0688
                                                                    365/63
8,318,566 B2    11/2012   Inoue et al.
(Continued)

FOREIGN PATENT DOCUMENTS

KR    20150145113 A    12/2019

*Primary Examiner* — Khiem D Nguyen

(57) ABSTRACT

A memory device and an electronic device including the same are provided. The memory device includes a first memory cell disposed at an intersection of first and second conductive lines that extend in first and second directions, respectively, a second memory cell spaced apart from the first memory cell by a first distance in the first direction, a third memory cell spaced apart from the first memory cell by a second distance in the second direction, a first insulating pattern disposed between the first memory cell and the second memory cell, and a second insulating pattern disposed between the first memory cell and the third memory cell. The second insulating pattern has a lower thermal conductivity than the first insulating pattern.

16 Claims, 14 Drawing Sheets

(56) References Cited

U.S. PATENT DOCUMENTS

| | | | |
|---|---|---|---|
| 9,385,312 B2* | 7/2016 | Lee | H01L 27/2481 |
| 9,716,129 B1* | 7/2017 | Sim | H01L 45/1233 |
| 10,263,183 B2* | 4/2019 | Sills | H01L 27/2463 |
| 2014/0162461 A1* | 6/2014 | Kim | H01L 21/31144 |
| | | | 438/703 |
| 2015/0162529 A1* | 6/2015 | Lee | H01L 45/141 |
| | | | 711/118 |
| 2015/0340610 A1* | 11/2015 | Jung | H01L 45/1233 |
| | | | 257/4 |
| 2015/0372060 A1* | 12/2015 | Terai | H01L 27/2463 |
| | | | 257/4 |
| 2016/0133671 A1* | 5/2016 | Fantini | H01L 27/2427 |
| | | | 257/4 |
| 2018/0375023 A1* | 12/2018 | Song | H01L 45/06 |
| 2019/0355905 A1* | 11/2019 | Yang | G11C 13/0004 |
| 2020/0105832 A1* | 4/2020 | Kang | H01L 45/143 |

* cited by examiner

MEMORY DEVICE AND ELECTRONIC DEVICE INCLUDING INSULATING PATTERNS WITH DIFFERENT THERMAL CONDUCTIVITIES

CROSS-REFERENCE TO RELATED APPLICATION

The present application claims priority under 35 U.S.C. § 119(a) to Korean patent application number 10-2018-0165557, filed on Dec. 19, 2018, which is incorporated herein by reference in its entirety.

BACKGROUND

Field of Invention

Embodiments of the present disclosure generally relate to a memory device and an electronic device including the same, and more particularly, to a variable resistance memory device and an electronic device including the same.

Description of Related Art

An electronic device such as a computer, a digital camera, or a smart phone processes data, includes a memory system. The memory system may include a memory device for storing data and a controller for controlling the memory device.

Various memory devices have been developed to satisfy the requirements of high performance, miniaturization, and low power consumption. A variable resistance memory device has been proposed as an example of next-generation memory devices. The variable resistance memory device may have a resistance state that changes depending on a voltage or a current applied to a memory cell, and maintain a resistance state stored in the memory cell even when power is turned off.

Examples of the variable resistance memory device are a Phase Change Random Access Memory (PRAM), a Magnetic RAM (MRAM), a Resistive RAM (RRAM), a Ferroelectric RAM (FRAM), an e-fuse, and the like.

SUMMARY

According to an aspect of the present disclosure, there is provided an electronic device including a memory device. The memory device includes a first memory cell disposed at an intersection of first and second conductive lines that extend in first and second directions, respectively, a second memory cell spaced apart from the first memory cell by a first distance in the first direction, a third memory cell spaced apart from the first memory cell by a second distance in the second direction, a first insulating pattern disposed between the first memory cell and the second memory cell, and a second insulating pattern disposed between the first memory cell and the third memory cell. The second insulating pattern has a lower thermal conductivity than the first insulating pattern.

According to another aspect of the present disclosure, there is provided a memory device including a plurality of first conductive lines each extending in a first direction, a plurality of second conductive lines each extending in a second direction, a plurality of memory cells disposed at respective intersections of the plurality of first conductive lines and the plurality of second conductive lines, a plurality of first insulating patterns each disposed between adjacent memory cells in the first direction, and a plurality of second insulating patterns each disposed between adjacent memory cells in the second direction. The second insulating patterns have a lower thermal conductivity than the first insulating patterns.

BRIEF DESCRIPTION OF THE DRAWINGS

Various embodiments will now be described more fully hereinafter with reference to the accompanying drawings; however, they may be embodied in different forms and should not be construed as being limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1A:
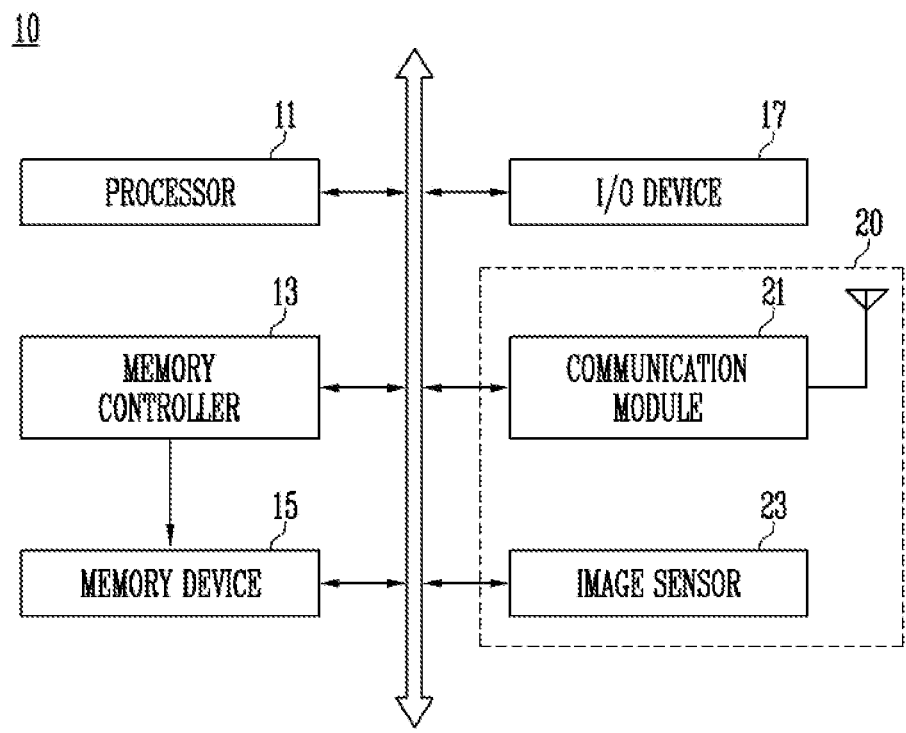
FIG. 1A illustrates an electronic device according to an embodiment.

Embodiments of the present disclosure can be variously modified and have various shapes. Thus, various embodiments are illustrated in the drawings and are intended to be described herein in detail. However, embodiments of the present disclosure are not construed as being limited to those described in the specification, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

Embodiments relate to a memory device capable of improving the operation reliability of one or more memory cells and an electronic device including the memory device.

Figure 1B:
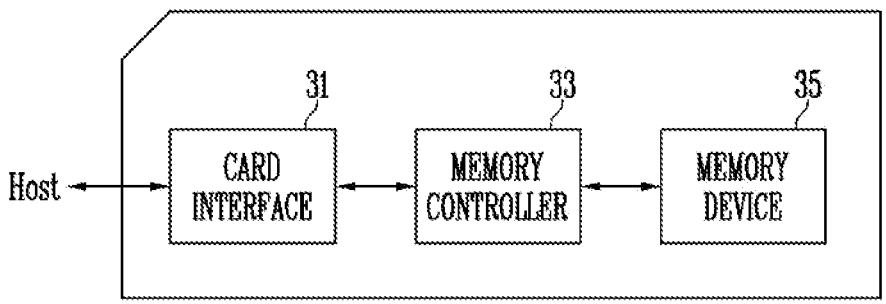
FIG. 1B illustrates an electronic device according to another embodiment.

FIGS. 1A and 1B illustrate electronic devices 10 and 30, respectively, according to embodiments of the present disclosure.

Referring to FIG. 1A, the electronic device 10 may include a processor, a memory controller 13, a memory device 15, an input/output (I/O) device 17, and a function module (or a function circuit) 20.

The memory controller 13 may control a data processing operation of the memory device 15, e.g., a program operation, a read operation, an erase operation, etc., under the control of the processor 11. In an embodiment, the memory controller 13 may be implemented as a portion of the processor 11, or be implemented as a chip separate from the processor 11.

The memory device 15 may be a nonvolatile memory device. For example, the memory device 15 may be a nonvolatile memory device including a variable resistance device.

Data programmed to the memory device 15 may be output through the I/O device 17 under the control of the processor 11 and the memory controller 13. For example, the I/O device 17 may include a display device, a speaker device, etc.

The I/O device 17 may be used to input a control signal for controlling an operation of the processor 11 or data to be processed by the processor 11. For example, the I/O device 17 may include a touch pad, a computer mouse, a pointing device, a keypad, a keyboard, etc.

The function module 20 is configured for performing one or more specific functions according to a type of the electronic device 10.

In an embodiment, the electronic device 10 may be implemented as a cellular phone, a smart phone, a Personal Digital Assistant (PDA), or a wireless Internet device. The function module 20 may include a communication module (or a communication circuit) 21 to connect the electronic device 10 to a wired or wireless communication network, thereby transferring a control signal, or data, or both therebetween.

In an embodiment, the electronic device 10 may be a digital camera or a digital camcorder. In other embodiments, the electronic device 10 may be a PC, a notebook computer, a mobile communication terminal, or the like, to which either one of the digital camera and the digital camcorder is attached. The function module 20 may include an image sensor 23. The image sensor 23 converts an optical image into digital image signals, and transfers the digital image signals to the processor 11 and the memory controller 13.

The electronic device 10 may include both the communication module 21 and the image sensor 23.

Referring to FIG. 1B, an electronic device 30 may be implemented as a memory card such as a PC card, a Compact Flash (CF) card, a Smart Media Card (SM or SMC), a memory stick, a Multi-Media Card (MMC, RS-MMC, or MMCmicro), an Secure digital Card (SD, miniSD, microSD, or SDHC), or a Universal Flash Storage (UFS).

The electronic device 30 may include a card interface 31, a memory controller 33, and a memory device 35.

The card interface 31 may interface data exchange between a host Host and the memory controller 33 according to a protocol of the host Host. In an embodiment, the card interface 31 may include one or more of hardware capable of supporting a protocol used by the host Host, software embedded in the hardware, and a signal transmission scheme.

The memory controller 33 controls data transfer between the memory device 35 and the card interface 31.

The memory device 35 may be a nonvolatile memory device. For example, the memory device 35 may be a nonvolatile memory device using a variable resistance element.

Embodiments of the present disclosure are not limited to the electronic devices 10 and 30 described above with reference to FIGS. 1A and 1B, respectively, and may include various electronic devices including a nonvolatile memory device using a variable resistance element.

Each of the memory device 15 of FIG. 1A and 35 of FIG. 1B may include one or more structures shown in FIGS. 2, 3, 4, 5A, 5B, 6A, 6B, and 6C. Hereinafter, a memory device according to an embodiment of the present disclosure will be described in more detail.

Figure 2:
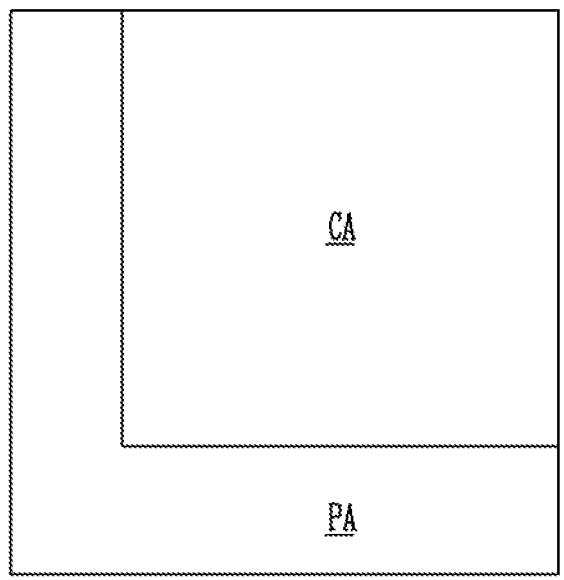
FIG. 2 illustrates a memory device according to an embodiment of the present disclosure.

FIG. 2 illustrates a memory device 100 according to an embodiment of the present disclosure.

Referring to FIG. 2, the memory device 100 includes a cell area CA and a peripheral area PA.

The cell area CA includes a memory cell array. The memory cell array includes a plurality of memory cells. In an embodiment, the memory cell array may have a cross point structure. The cross point structure includes conductive lines intersecting each other and memory cells respectively disposed in intersection areas of the conductive lines. The cell area CA may include a cross point structure disposed in a single layer. Alternatively, the cell area CA may include a three-dimensional memory cell array having two or more cross point structures respectively disposed in two or more layers.

The peripheral area PA includes a logic circuit for performing a program operation, a read operation, etc., on the memory cell array. For example, the peripheral area PA may include a column select circuit, a row select circuit, a sensing amplification circuit, and one or more voltage generators.

Figure 3:
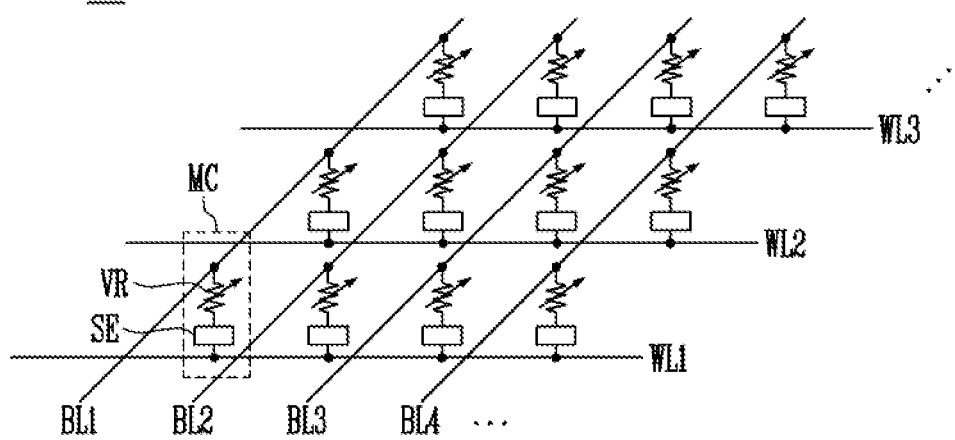
FIG. 3 illustrates a memory cell array according to an embodiment of the present disclosure.

FIG. 3 illustrates a memory cell array 110 according to an embodiment of the present disclosure.

Referring to FIG. 3, the memory cell array 110 may include word lines WL1 to WL3 that extend in a first direction and are spaced apart from each other. The memory cell array 110 may further include bit lines BL1 to BL4 that extend in a second direction and intersect the word lines WL1 to WL3. The number (e.g., 3) of word lines WL1 to WL3 and the number (e.g., 4) of bit lines BL1 to BL4 shown in FIG. 3 may vary according to embodiments.

Memory cells MC are respectively formed in intersection areas of the word lines WL1 to WL3 and the bit lines BL1 to BL4. Each of the memory cells MC may include a selection device (or a selection layer) SE and a variable resistance device (or a variable resistance layer) VR. In the embodiment shown in FIG. 3, the selection device SE may be electrically connected to a corresponding one of the word lines WL1 to WL3 and the variable resistance device VR. The variable resistance device VR may be electrically connected to a corresponding one of the bit lines BL1 to BL4 and the selection device SE. However, embodiments of the present disclosure are not limited thereto. For example, the selection device SE may be electrically connected to a corresponding one of the bit lines BL1 to BL4 and the variable resistance device VR, and the variable resistance device VR may be electrically connected to a corresponding one of the word lines WL1 to WL3 and the selection device SE.

The selection device SE may control the flow of a current according to the magnitude of a voltage or a current applied thereto. The selection device SE may be implemented with various elements such as a MOS transistor, a PN diode, and an Ovonic Threshold Switching (OTS) device.

The variable resistance device VR may include a variable resistance layer that can have different resistance states according to a voltage or a current applied thereto. The variable resistance device VR may include materials used for various non-volatile memories such as a Phase Change Random Access Memory (PRAM), a Magnetic RAM (MRAM), a Resistive RAM (RRAM), and a Ferroelectric RAM (FRAM).

When a voltage or a current is applied to a variable resistance layer of a memory cell to perform a specific operation on the memory cell, heat may be transferred from the memory cell to one or more adjacent memory cells. For example, when the memory cell is a phase change memory (PCM) cell on which a reset programming operation is performed, heat diffusion from the programmed region in the memory cell may cause a temperature rise in adjacent PCM cells, and this situation may be referred to as thermal disturbance. The temperature rise in the adjacent PCM cells can expedite the drift behavior, thereby increasing threshold switching voltage variations. Accordingly, thermal disturbance caused by heat transferred from a memory cell MC may deteriorate the operation reliability of adjacent memory cells MC. In particular, when the memory cells are densely disposed to improve the degree of integration of the memory cells MC, distances between adjacent memory cells are decreased, thereby increasing the effect of the thermal disturbance.

Figure 4:
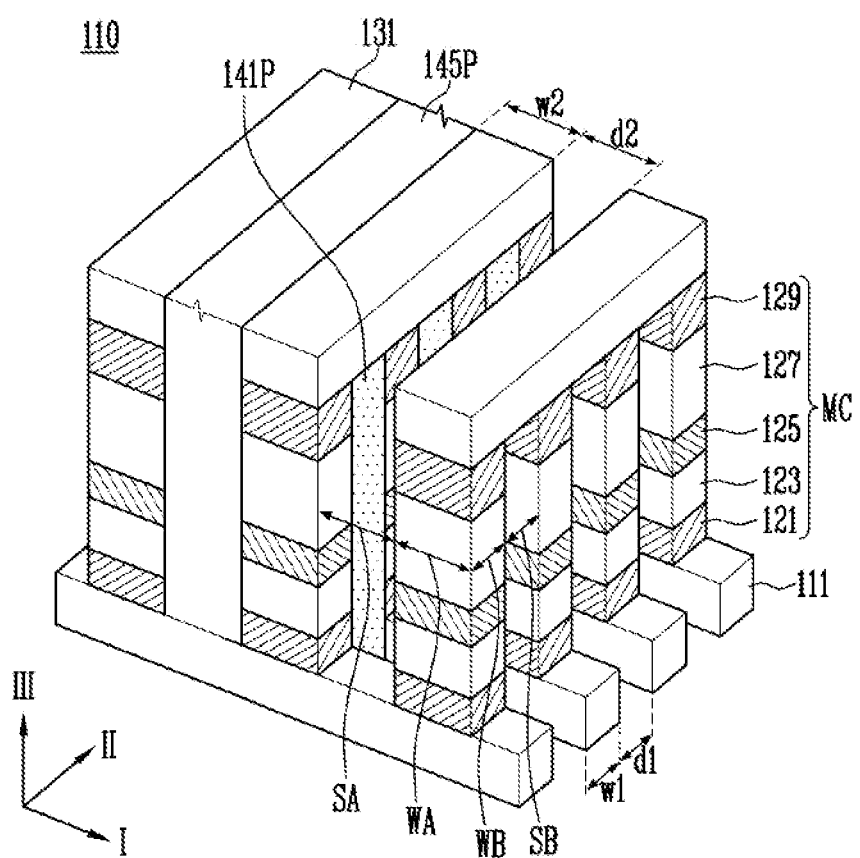
FIG. 4 is a perspective view illustrating the memory cell array of FIG. 3 according to an embodiment of the present disclosure.
Figure 5A:
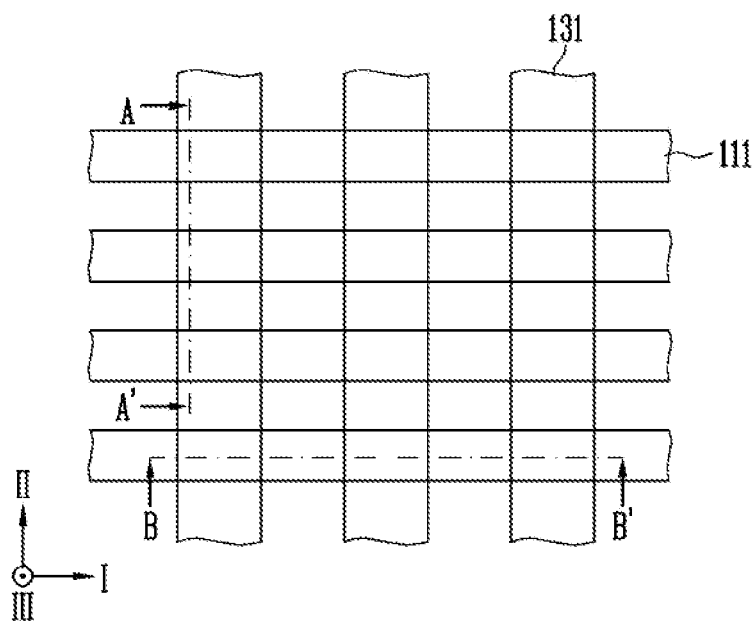
FIG. 5A is a first plan view of the memory cell array of FIG. 4 according to an embodiment of the present disclosure.
Figure 5B:
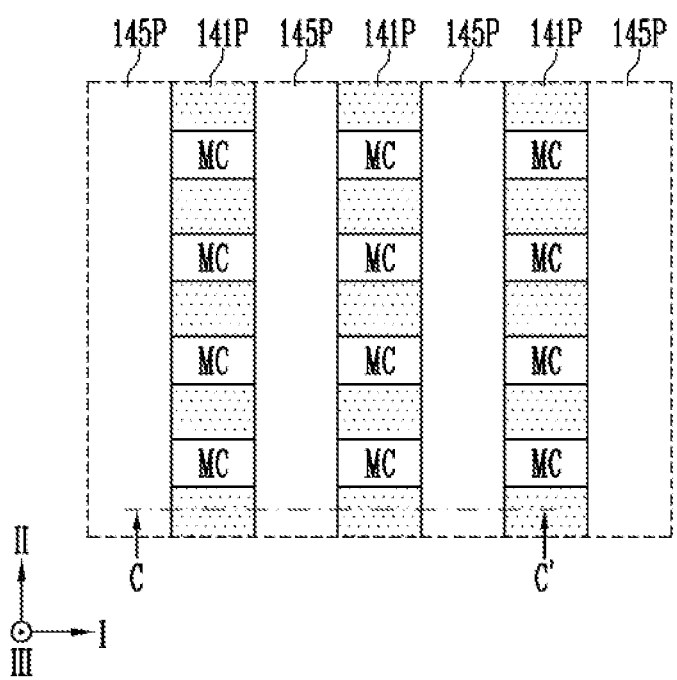
FIG. 5B is a second plan view of the memory cell array of FIG. 4 according to an embodiment of the present disclosure.

In an embodiment of the present disclosure, a first memory cell and a second memory cell are spaced apart from each other by a first distance in a first lateral direction (e.g., a first direction I in FIGS. 4, 5A, and 5B), and the first memory cell and a third memory cell are spaced apart from each other by a second distance in a second lateral direction (e.g., a second direction II in FIGS. 4, 5A, and 5B). A first thermal resistance between the first memory cell and the third memory cell arranged in the second lateral direction and a second thermal resistance between the first and second memory cells arranged in the first lateral direction may be determined to reduce the effect of thermal disturbance. For example, when the second distance between the first and third memory cells arranged in the second lateral direction is shorter than the first distance between the first and second memory cells arranged in the first lateral direction, the first and third memory cells are more susceptible to the thermal disturbance due to the shorter distance. When a first insulating pattern fills a space between the first and third memory cells, the first thermal resistance between the first and third memory cells includes a thermal resistance of the first insulating pattern. The thermal resistance of the first insulating pattern is inversely proportional to a thermal conductivity of the first insulating pattern. Thus, when the first insulating pattern filling between the first and third memory cells has the thermal conductivity lower than that of a second insulating pattern filling between the first and second memory cells, the first thermal resistance between the first and third memory cells may be equal to or greater than the second thermal resistance between the first and second memory cells. As a result, the amount of heat transferred from the first memory cell to the third memory cell in the second lateral direction may be reduced, and the effect of the thermal disturbance may be reduced to improve the operation reliability of the memory cells MC.

FIG. 4 is a perspective view illustrating the memory cell array 110 shown in FIG. 3 according to an embodiment.

Referring to FIG. 4, the memory cell array 110 may include first conductive lines 111, second conductive lines 131, memory cells MC, first insulating patterns 141P, and second insulating patterns 145P. Some of the first insulating patterns 141P and some of the second insulating patterns 145P are omitted in FIG. 4 for illustrative purposes, to more clearly show the arrangement of the memory cells MC of the memory cell array 110. In an embodiment, the first conductive lines 111 may function as word lines (e.g., the word lines WL1 to WL3 of FIG. 3), and the second conductive lines 131 may function as bit lines (e.g., the bit lines BL1 to BL4 of FIG. 3). In another embodiment, the first conductive lines 111 may function as the bit lines, and the second conductive lines 131 may function as the word lines.

The first conductive lines 111 and the second conductive lines 131 intersect each other. For example, the first conductive lines 111 may extend in a first direction I, and the second conductive lines 131 may extend in a second direction II intersecting the first direction I. The second conductive lines 131 may be disposed over the first conductive lines 111 and spaced apart from the first conductive lines 111 by a given distance in a third direction III. The third direction III is a direction perpendicular to a plane defined by the first direction I and the second direction II.

Each adjacent pair of the first conductive lines 111 may be spaced apart from each other by a first distance d1 in the second direction II, and each of the first conductive lines 111 may have a first width w1 in the second direction II. Each adjacent pair of the second conductive lines 131 may be spaced apart from each other by a second distance d2 in the first direction I, and each of the second conductive lines 131 may have a second width w2 in the first direction I.

In an embodiment of the present disclosure, the first distance d1, or the first width w1, or both may be decreased to increase the degree of integration of the memory cells MC. In such an embodiment, the second distance d2 may be longer than the first distance d1, or the second width w2 may be wider than the first width w1, or both, thereby keeping a critical dimension of the second conductive lines 131 and the second insulating patterns 145P sufficiently large to address the difficulty in forming the second conductive lines 131 and the second insulating patterns 145P.

The memory cells MC may be disposed between the first conductive lines 111 and the second conductive lines 131 at respective intersections of the first conductive lines 111 and the second conductive lines 131. Adjacent memory cells MC may be spaced apart from each other in the first direction I, or the second direction II, or both.

A third distance SB between adjacent memory cells MC in the second direction II and a fourth distance SA between adjacent memory cells MC in the first direction I are related to the first distance d1 between adjacent first conductive lines 111 and the second distance d2 between adjacent second conductive lines 131, respectively. For example, the adjacent memory cells MC in the first direction I are spaced apart from each other by the fourth distance SA that is longer than the third distance SB between the adjacent memory cells MC in the second direction II, when the second distance d2 is longer than the first distance d1. A third width WB of each of the memory cells MC in the second direction II and a fourth width WA of each of the memory cells MC in the first direction I are related to the first width w1 of each of the first conductive lines 111 and the second width w2 of each of the second conductive lines 131, respectively. For example, each of the memory cells MC has the fourth width WA in the first direction I that is wider than the third width WB in the second direction II, when the second width w2 is wider than the first width w1.

Each of the memory cells MC may include a lower electrode 121, a selection device layer 123, an intermediate electrode 125, a variable resistance layer 127, and an upper electrode 129, which are stacked between a corresponding one of the first conductive lines 111 and a corresponding one of the second conductive lines 131. In an embodiment, one or more of the lower electrode 121, the intermediate electrode 125, and the upper electrode 129 may be omitted.

Each of the first insulating patterns 141P may extend in the third direction III to fill a space between sidewalls of memory cells MC adjacent in the second direction II and fill a space between sidewalls of portions of adjacent first conductive lines 111. For example, these portions of the adjacent first conductive lines 111 substantially overlap with the adjacent memory cells MC when seen in the third direction III, respectively.

Each of the second insulating patterns 145P may extend to fill a space between sidewalls of second conductive lines 131 adjacent in the first direction I, fill a space between sidewalls of memory cells MC adjacent in the first direction I, and fill a space between first insulating patterns 141P adjacent in the first direction I. Each of the second insulating patterns 145P may extend in the second direction II.

In the embodiment shown in FIG. 4, the third distance SB between adjacent memory cells MC in the second direction II is shorter than the fourth distance SA between adjacent memory cells MC in the first direction I. In such an embodiment, the first insulating patterns 141P have a thermal conductivity lower than that of the second insulating patterns 145P.

The adjacent memory cells MC in the second direction II are arranged at the third distance SB shorter than the fourth distance SA between the adjacent memory cells MC in the first direction I, and therefore, the effect of thermal disturbance in the second direction II may be greater than that in the first direction I. According to the embodiment of FIG. 4, each of the first insulating patterns 141P having a relatively low thermal conductivity is disposed between memory cells MC adjacent in the second direction II, compared to that of the second insulating patterns 145P. As a result, a first thermal resistance between the adjacent memory cells MC in the second direction II is increased compared to when the first insulating patterns 141 have the same thermal conductivity as the second insulating patterns 145P. For example, the first thermal resistance between the adjacent memory cells MC in the second direction II may be equal to or greater than a second thermal resistance between the adjacent memory cells MC in the first direction. Accordingly, after heat has been generated from each of the memory cells MC, an amount of heat transferred in the second direction II may be reduced, thereby reducing the effect of thermal disturbance between the adjacent memory cells MC in the second direction II.

In the embodiment of FIG. 4, a portion of the heat generated from each of the memory cells MC is transferred between adjacent memory cells MC in the first direction I through a corresponding one of the second insulating patterns 145P having a higher conductivity than that of the first insulating pattern 141P. According to the embodiment of FIG. 4, the adjacent memory cells MC in the first direction I are spaced apart from each other at the fourth distance SA longer than the third distance SB. The second thermal resistance between the adjacent memory cells MC in the first direction is proportional to the fourth distance SA, and thus the second thermal resistance is relatively large. A critical dimension (e.g., the fourth distance SA) of the second conductive lines 131 and the second insulating patterns 145P is relatively large, and thus the second conductive lines 131 and the second insulating patterns 145P may be formed relatively easily. Accordingly, the effect of thermal disturbance between the adjacent memory cells MC adjacent in the first direction I is kept relatively small while the difficulty in forming the second conductive lines 131 and the second insulating patterns 145P is addressed.

FIGS. 5A and 5B are plan views each illustrating the memory cell array 110 shown in FIG. 4 according to an embodiment of the present disclosure.

FIG. 5A illustrates a layout of first conductive lines 111 and second conductive lines 131. Referring to FIG. 5A, the first conductive lines 111 and the second conductive lines 131 intersect each other. Although the second conductive lines 131 are disposed over the first conductive lines 111 in the embodiment of FIG. 4, embodiments of the present disclosure are not limited thereto. For example, the first conductive lines 111 may be disposed over the second conductive lines 131 and spaced apart from the second conductive lines 131 in the third direction III.

FIG. 5B illustrates a layout of first insulating patterns 141P and second insulating patterns 145P.

Memory cells MC are respectively disposed at intersections of the first conductive lines 111 and the second conductive lines 131, which are shown in FIG. 5A. Memory cells MC arranged in the first direction I may define a memory row. Memory cells MC arranged in the second direction II may define a memory column. That is, the first direction I may be defined as a row direction, and the second direction II may be defined as a column direction. Memory cells MC included in the same memory row may be commonly connected to one of the first conductive lines 111 shown in FIG. 5A. Memory cells MC included in the same memory column may be commonly connected to one of the second conductive lines 131 shown in FIG. 5A.

In an embodiment, the first insulating patterns 141P are arranged to be spaced apart from each other in the first direction I and the second direction II. First insulating patterns 141P arranged in the first direction I may define a row pattern. First insulating patterns 141P arranged in the second direction II may define a column pattern.

The second insulating patterns 145P each extend in the second direction II, and adjacent second insulating patterns 145P are spaced apart from each other by a given distance (e.g., the second width W2 in FIG. 4) in the first direction I.

The column pattern of the first insulating patterns 141P and the memory column of the memory cells MC are disposed between adjacent second insulating patterns 145P in the first direction I. Each of the memory cells MC is disposed between adjacent first insulating patterns 141P in the second direction II. That is, the memory cells MC in a memory column and the first insulating patterns 141P in a corresponding column pattern are alternately disposed in the second direction II. In an embodiment, the memory cells MC and the first insulating patterns 141P that are alternately disposed in the second direction II each have substantially the same width in the first direction I. For example, a difference between widths in the first direction I of any pair selected from the memory cells MC and the first insulating patterns 141P is equal to or less than 0.1%, 0.3%, 0.5%, 1%, 3%, and 5% of an average width of the memory cells MC and the first insulating patterns 141P.

According to an embodiment of the present disclosure, adjacent second insulating patterns 145P in the first direction I may be spaced apart from each other by a distance longer than that between adjacent first insulating patterns 141P in the second direction II. According to an embodiment of the present disclosure, a width of each of the second insulating patterns 145P in the first direction I may be wider than that of each of the first insulating patterns 141P in the second direction II.

Figure 6A:
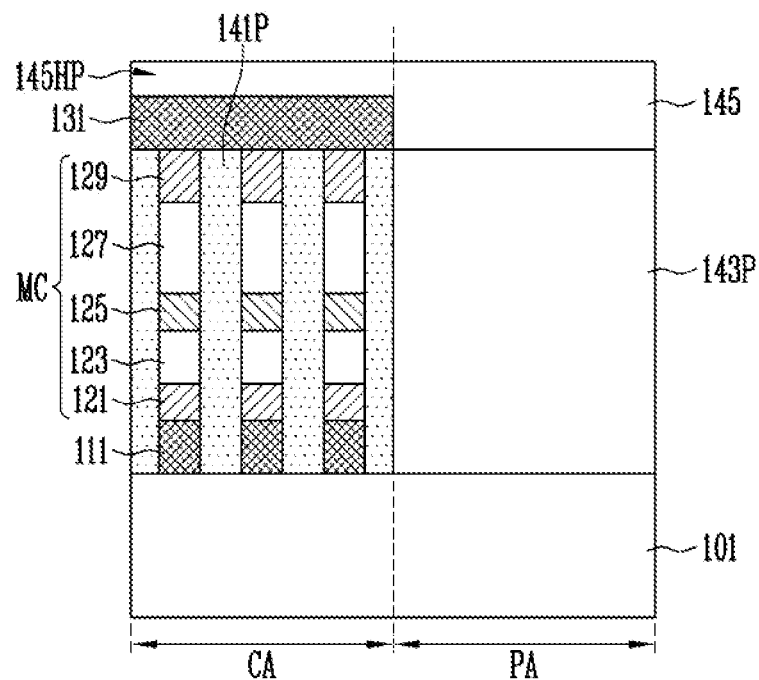
FIG. 6A is a cross-sectional view of a memory device along line A-A' of FIG. 5A according to an embodiment.
Figure 6B:
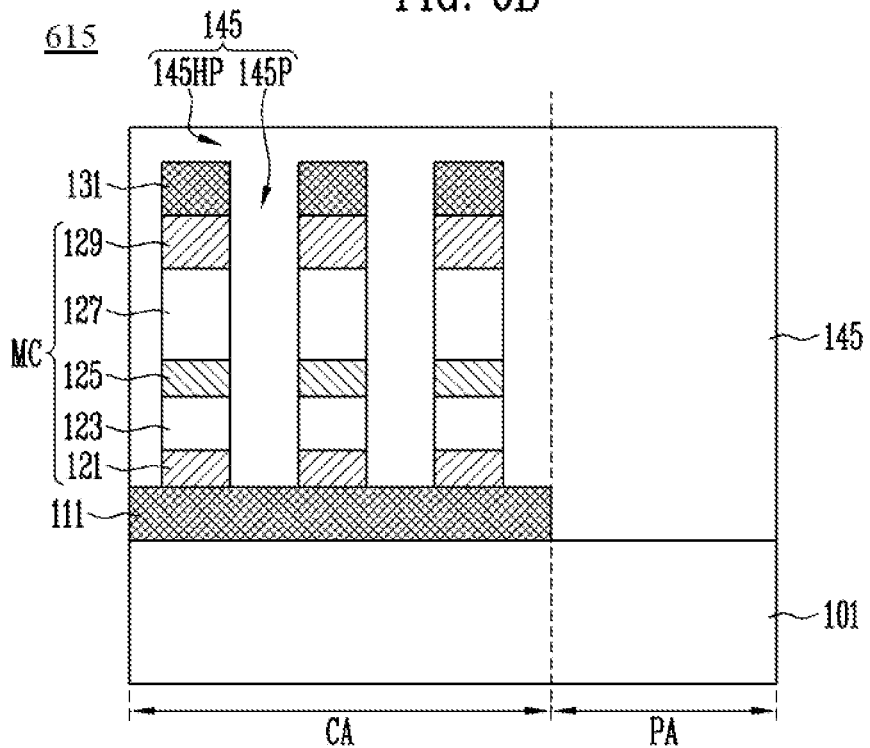
FIG. 6B is a cross-sectional view of a memory device along line B-B' of FIG. 5A according to an embodiment.
Figure 6C:
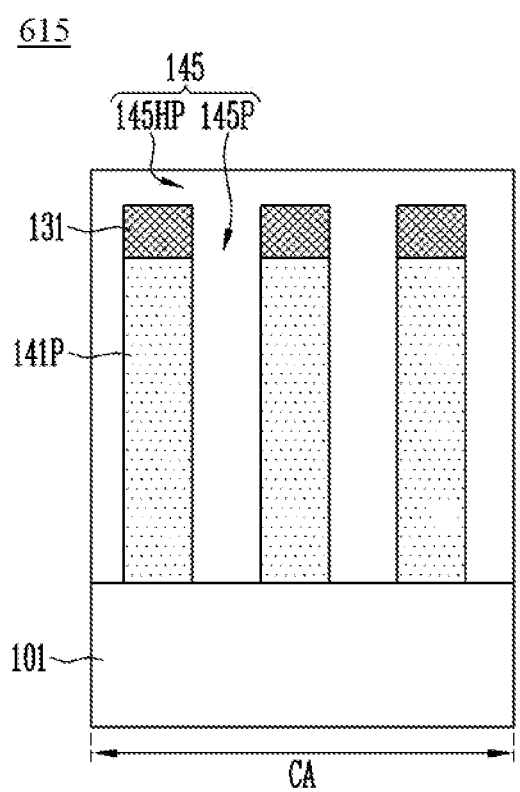
FIG. 6C is a cross-sectional view of a memory device along line C-C' of FIG. 5B according to an embodiment.

FIGS. 6A to 6C are cross-sectional views illustrating a memory device 615 including the memory cell array 110 shown in FIG. 4.

Referring to FIGS. 6A to 6C, the memory device 615 includes a cell area CA (e.g., the cell area CA in FIG. 2) and a peripheral area PA (e.g., the peripheral area PA in FIG. 2). The cell area CA may include the memory cell array 110 shown in FIGS. 4, 5A, and 5B.

The cross-sectional view of the cell area CA shown in FIG. 6A is a cross-sectional view of the memory cell array 110 of FIG. 4 taken along line A-A' of FIG. 5A, the cross-sectional view of the cell area CA shown in FIG. 6B is a cross-sectional view of the memory cell array 110 taken along line B-B' of FIG. 5A, and the cross-sectional view of the cell area CA shown in FIG. 6C is a cross-sectional view of the memory cell array 110 taken along line C-C' of FIG. 5B. Hereinafter, detailed descriptions of some features that are similar to those described above with reference to FIGS. 4, 5A, and 5B will be omitted for the interest of brevity.

Referring to FIGS. 6A to 6C, first conductive lines 111, memory cells MC, and second conductive lines 131 may be disposed on a cell area CA of a substrate 101.

The substrate 101 may include a peripheral circuit (not shown) including one or more transistors (not shown), one or more contacts (not shown), one or more conductive lines (not shown), and one or more lower insulating layers (not shown) at least partially covering the peripheral circuit.

A peripheral area PA of the substrate 101 including the peripheral circuit (not shown) may be covered by an interlayer insulating pattern 143P. The interlayer insulating pattern 143P may include the same material as second insulating patterns 145P. In an embodiment, the interlayer insulating pattern 143P may include silicon oxide. The interlayer insulating patterns 143P may extend up to a height at which upper surfaces of first insulating patterns 141P and upper surfaces of upper electrodes 129 are disposed.

The first conductive lines 111 are disposed between adjacent first insulating patterns 141P and under the memory cells MC. The first conductive lines 111 overlap with the memory cells MC. Each of the first conductive lines 111 extends in a first direction intersecting a second direction in which each of the second conductive lines 131 extends and is disposed under the second insulating patterns 145P. The first conductive lines 111 may include a metal. For example, the first conductive lines 111 may include tungsten, copper, aluminum, titanium, tantalum, or the like.

In an embodiment, the first insulating patterns 141P are patterns that remain between adjacent memory cells MC after a first insulating layer is planarized.

Each of the second conductive lines 131 overlaps with the first insulating patterns 141P and memory cells MC, which are arranged in the second direction. The second conductive lines 131 may include a metal. For example, the second conductive lines 131 may include tungsten, copper, aluminum, titanium, tantalum, or the like.

A second insulating layer 145 may include a horizontal part 145HP and the second insulating patterns 145P. The second insulating patterns 145P extends from the horizontal part 145HP in a third direction that is perpendicular to a plane defined by the first and second directions. The second insulating patterns 145P fill a space between adjacent second conductive lines 131. The horizontal part 145HP covers upper surfaces of the second conductive lines 131. The second insulating layer 145 may extend in the second direction toward the peripheral area PA of the substrate 101 to cover the interlayer insulating pattern 143P.

The first insulating patterns 141P may have a thermal conductivity lower than that of the second insulating patterns 145P. In an embodiment, the thermal conductivity of the first insulating patterns 141P is in a range from 30% to 70%, 40% to 60%, 45% to 55%, 47% to 53%, or 48% to 52% of that of the second insulating patterns 145P. For example, each of the first insulating patterns 141P may include an oxide having carbon content higher than that of each of the second insulating layer 145. In an embodiment, each of the first insulating patterns 141P may include a first oxide containing carbon of 15 to 20 wt %, and the second insulating layer 145 may include a second oxide containing substantially no carbon. In another embodiment, each of the first insulating patterns 141P may include a first oxide containing carbon of 20 to 25 wt %, and the second insulating layer 145 may include a second oxide containing carbon of 15 to 20 wt %.

When each of the first insulating patterns 141P includes the first oxide having the above-described carbon content, a dielectric constant of each of the first insulating patterns 141P may become lower than that of each of the second insulating patterns 145P. Accordingly, a parasitic capacitance between adjacent first conductive lines 111 and a parasitic capacitance between adjacent memory cells MC may be reduced. For example, when each of the first insulating patterns 141P includes the first oxide containing carbon in a range from about 15 to 20 wt % and the second insulating layer 145 includes the second oxide containing substantially no carbon, each of the first insulating patterns 141P may have a dielectric constant in a range from 2.7 to 3.0, and each of the second insulating patterns 145P may include a dielectric constant in a range from 3.8 to 4.0. When each of the first insulating patterns 141P includes the first oxide containing carbon in a range from about 20 to about 25 wt % and the second insulating layer 145 includes the second oxide containing carbon in a range from about 15 to about 20 wt %, each of the first insulating patterns 141P may have a dielectric constant in a range from 2.0 to 2.3, and each of the second insulating patterns 145P may have a dielectric constant in a range from 2.7 to 3.0. For example, the first oxide contains carbon in a range from 19% to 26%, from 19.5% to 25.5%, from 19.7% to 25.3%, 19.9% to 25.1%, 19.97% to 25.03%, or 19.99% to 25.01%.

Each of the second conductive lines 131 overlaps with a plurality of first insulating patterns 141P, adjacent ones of the plurality of the first insulating patterns 141P are spaced apart from each other, and each of the plurality of the first insulating patterns 141P fills a space between adjacent first conductive lines 111.

Each of the memory cells MC may include a lower electrode 121, a selection device layer 123, an intermediate electrode 125, a variable resistance layer 127, and the upper electrode 129, and be disposed in an island shape at each of intersections between the first conductive lines 111 and the second conductive lines 131. In the embodiment shown in FIGS. 6A, 6B, and 6C, the lower electrode 121, the selection device layer 123, the intermediate electrode 125, the variable resistance layer 127, and the upper electrode 129 may be sequentially stacked over a first conductive lines 111. However, embodiments of the present disclosure are not limited thereto, and the lower electrode 121, the selection device layer 123, the intermediate electrode 125, the variable resistance layer 127, and the upper electrode 129 may be vertically stacked in an inverse order to that shown in FIGS. 6A, 6B, and 6C between a first conductive line 111 and a second conductive line 131.

Each of the lower electrode 121, the intermediate electrode 125, and the upper electrode 129 may include one or more conductive materials. For example, each of the lower electrode 121, the intermediate electrode 125, and the upper electrode 129 may include a metal or metal nitride. In an embodiment, the intermediate electrode 125 may function as a heating electrode and to transfer heat to the variable resistance layer 127. In such an embodiment, the intermediate electrode 125 may include a conductive material having a resistance larger than that of the lower electrode 121, or the upper electrode 129, or both. For example, the intermediate electrode 125 may include carbon.

The lower electrode 121 may contact an upper surface of a first conductive line 111. The intermediate electrode 125 may be disposed between the selection device layer 123 and the variable resistance layer 127. The upper electrode 129 may be electrically connected to a second conductive line 131.

The selection device layer 123 may be a current control layer configured for controlling the flow of a current through the memory cell MC.

In an embodiment, the selection device layer 123 may include a chalcogenide-based Ovonic Threshold Switching (OTS) material. For example, the selection device layer 123 may include arsenic (As), and include a compound including two or more of silicon (Si), germanium (Ge), antimony (Sb), tellurium (Te), selenium (Se), indium (In), and tin (Sn).

In an embodiment, the selection device layer 123 may include a rectifier diode. For example, the selection device layer 123 may include a silicon diode formed by joining a poly-silicon layer doped with a P-type impurity and a poly-silicon layer doped with an N-type impurity, or an oxide diode formed by joining a p-NiOx layer and a n-TiOx layer, or an oxide diode formed by joining a p-CuOx layer and a n-TiOx layer.

In an embodiment, the selection device layer 123 may include an oxide that substantially prevents a current from flowing since it has high resistance when a voltage having a level less than a given voltage is applied thereto, whereas the selection device layer 123 may allow a current to flow since it has low resistance when the applied voltage is equal to or higher than the given voltage. For example, the selection device layer 123 may include ZnOx, MgOx, AlOx, or the like.

The variable resistance layer 127 may reversibly switches between different resistance states depending on a voltage or current.

In an embodiment, the variable resistance layer 127 may include a phase change material having an amorphous state or a crystalline state that is induced by electrical Joule heating. The phase change material has a low resistance in the crystalline state, and has a high resistance in the amorphous state. Thus, the variable resistance layer 127 can store data by performing a set operation of changing the phase change material from the amorphous state having a high resistance to the crystalline state having a low resistance and by performing a reset operation of changing the phase change material from the crystalline state to the amorphous state. The phase change material may include a chalcogenide-based material. For example, the chalcogenide-based material may be a GST-based material including germanium (Ge), antimony (Sb), and tellurium (Te) at a predetermined ratio.

In an embodiment, the variable resistance layer 127 may include a material of which electrical resistance is changed depending on whether magnetization alignment between two ferromagnetic plates is parallel or anti-parallel, the magnetization alignment being induced by a magnetic field or spin transfer torque. The variable resistance layer 127 may have a low resistance state when the magnetization alignment is parallel, and have a high resistance state when the magnetization alignment is anti-parallel. For example, the variable resistance layer may include a ferromagnetic material including iron (Fe), nickel (Ni), cobalt (Co), dysprosium (Dy), gadolinium (Gd), or the like.

In an embodiment, the variable resistance layer 127 may include a material of which resistance is decreased since one or more conductive paths are generated when a relatively high voltage is applied thereto. For example, the variable resistance layer 127 may include a perovskite-based material such as $STO(SrTiO_3)$, $BTO(BaTiO_3)$ or $PCMO(Pr1—XCaXMnO_3)$, or a transition metal oxide such as zirconium oxide, hafnium oxide or aluminum oxide.

Figure 7A:
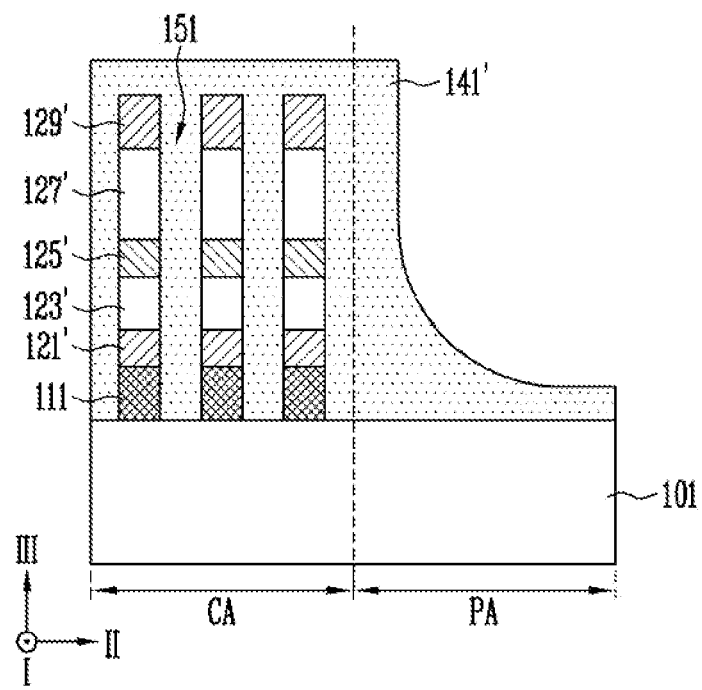
FIGS. 7A, 7B, 8A, 8B, 8C, 9A, 9B, 10A, 10B, and 10C illustrate a manufacturing process of a memory device according to an embodiment of the present disclosure.
Figure 7B:
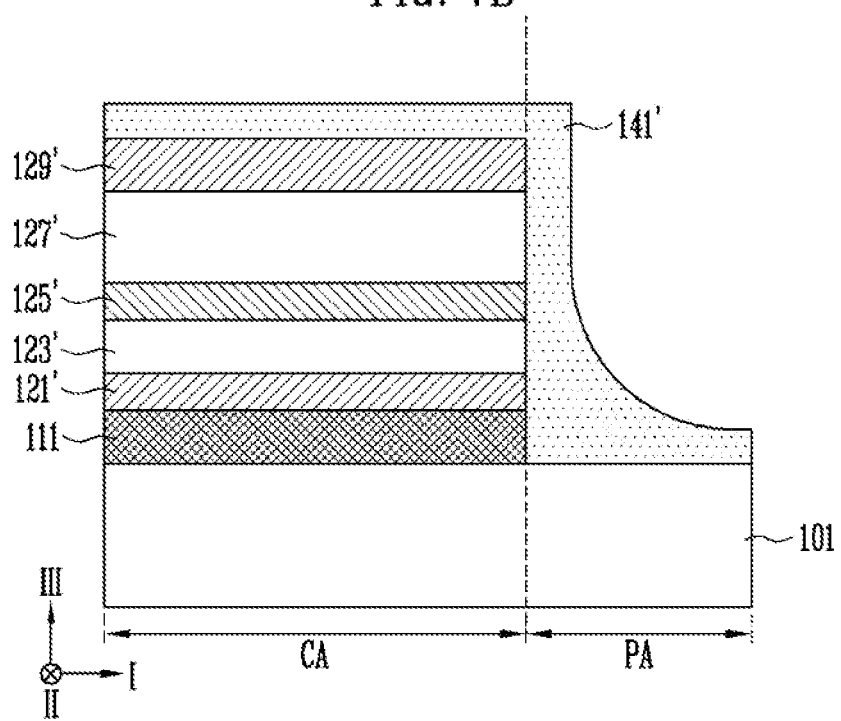
Figure 8A:
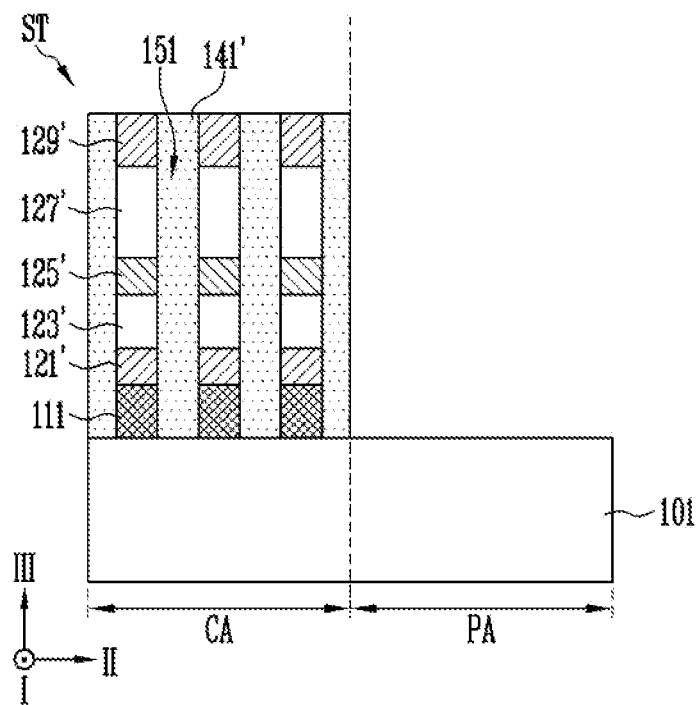
Figure 8B:
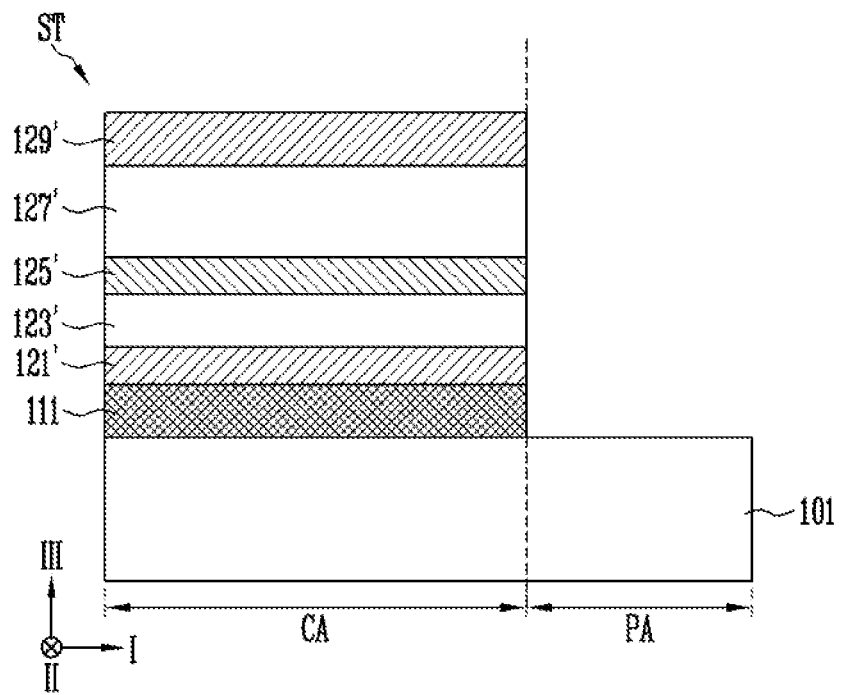
Figure 8C:
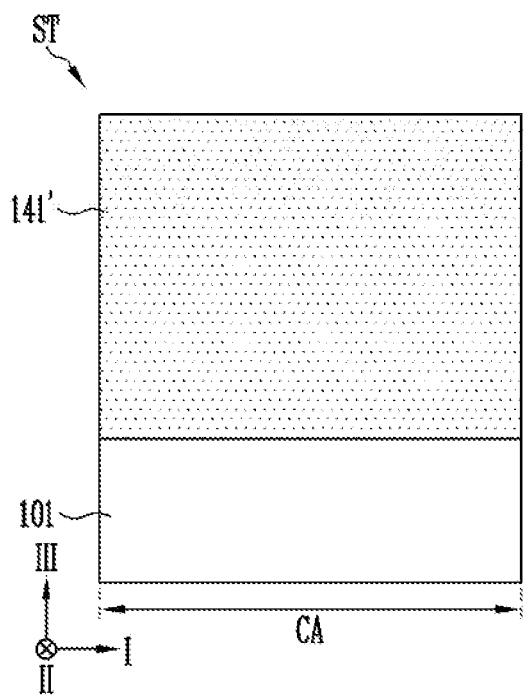
Figure 9A:
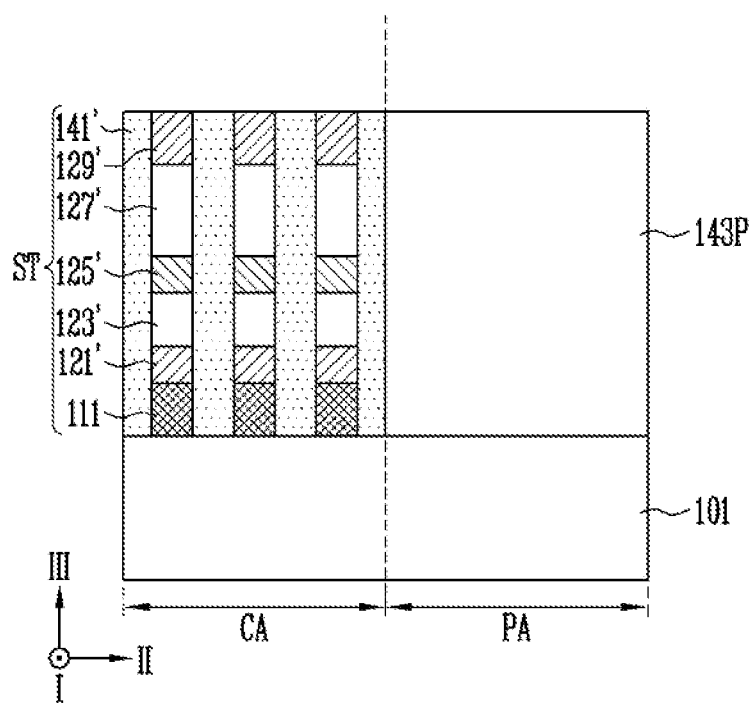
Figure 9B:
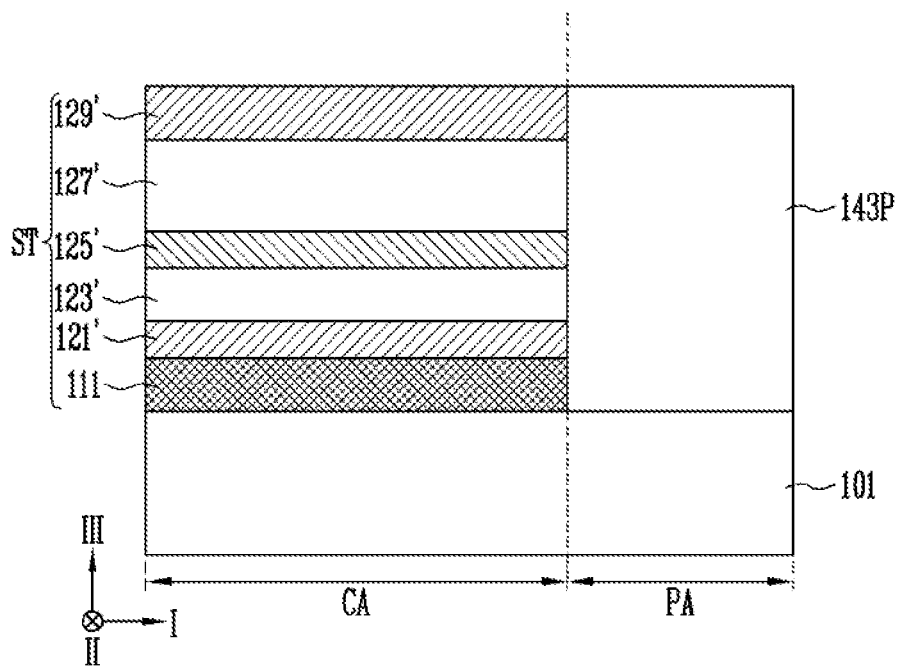
Figure 10A:
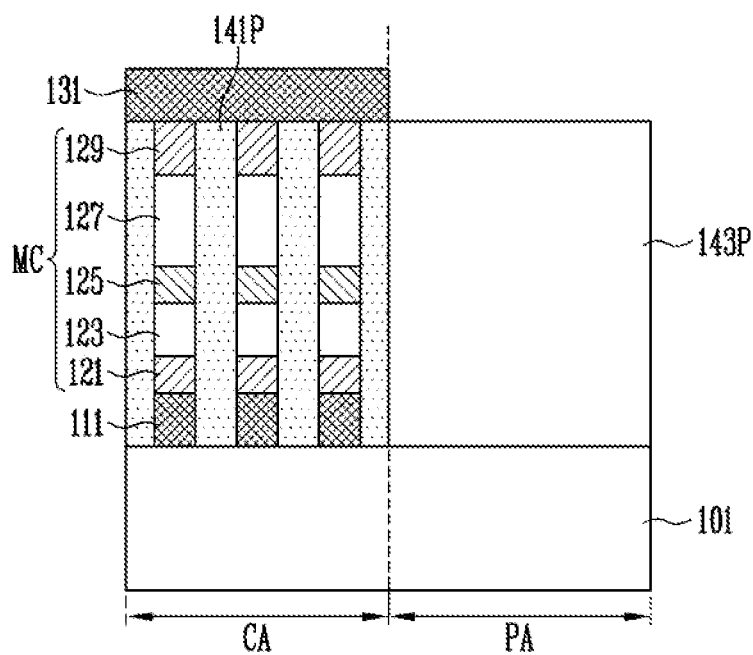
Figure 10B:
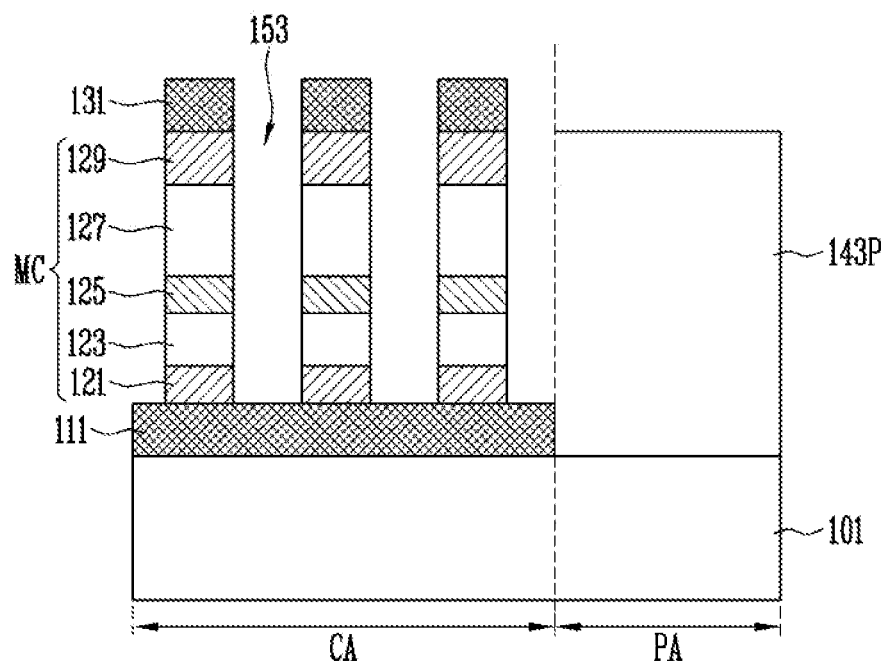
Figure 10C:
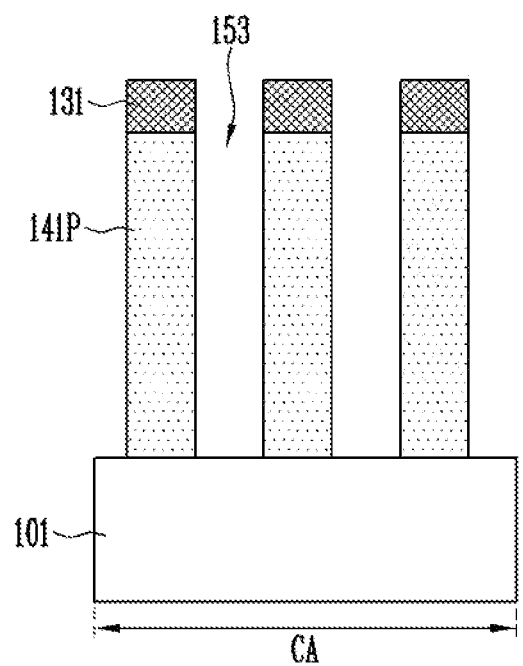

FIGS. 7A, 7B, 8A, 8B, 8C, 9A, 9B, 10A, 10B, and 10C illustrate a manufacturing process of a memory device according to an embodiment of the present disclosure. Each of FIGS. 7A, 8A, 9A, and 10A is a cross-sectional view including the cell area CA and the peripheral area PA. Each of the cross-sectional views of the cell area CA in FIGS. 7A, 8A, 9A, and 10A corresponds to that taken along line A-A' of FIG. 5A. Each of FIGS. 7B, 8B, 9B, and 10B is a cross-sectional view including the cell area CA and the peripheral area PA. Each of the cross-sectional views of the cell area CA in FIGS. 7B, 8B, 9B, and 10B corresponds to that taken along line B-B' of FIG. 5A. Each of FIGS. 8C and 10C is a cross-sectional view including the cell area CA. Each of the cross-sectional views of the cell area CA in FIGS. 8C and 10C corresponds to that taken along the line C-C' shown in FIG. 5B.

Hereinafter, detailed descriptions of some features similar to those described above with reference to FIGS. 6A to 6C will be omitted for the interest of brevity.

Referring to FIGS. 7A and 7B, a first conductive layer (not shown), a lower electrode layer (not shown), a selection device material layer (not shown), an intermediate electrode layer (not shown), a variable resistance material layer (not shown), and an upper electrode layer (not shown) are formed over a substrate 101 including a cell area CA and a peripheral area PA.

Subsequently, the first conductive layer (not shown), the lower electrode layer (not shown), the selection device material layer (not shown), the intermediate electrode layer (not shown), the variable resistance material layer (not shown), and the upper electrode layer (not shown) are etched through an etching process using a plurality of mask patterns (not shown). For example, the plurality of mask patterns are formed over the upper electrode layer (not shown) such that the mask patterns each extend in a first direction I and adjacent mask patterns are spaced apart from each other by a given distance corresponding to a target distance between adjacent first conductive lines 111, thereby functioning as an etch barrier during the etching process. Accordingly, the first conductive lines 111 each extending in the first direction I may be formed, and the lower electrode lines 121', the selection device lines 123', the intermediate electrode lines 125', the variable resistance lines 127', and the upper electrode lines 129' may be formed to extend in the same direction as the first conductive lines 111. In addition, adjacent first conductive lines 111, adjacent lower electrode lines 121', adjacent selection device lines 123', adjacent intermediate electrode lines 125', adjacent variable resistance lines 127', and adjacent upper electrode lines 129' may define a first opening 151.

Portions of the first conductive layer (not shown), the lower electrode layer (not shown), the selection device material layer (not shown), the intermediate electrode layer (not shown), the variable resistance material layer (not shown), and the upper electrode layer (not shown) may be removed in the peripheral area PA over the substrate 101 through the etching process. The mask patterns may be removed after the etching process.

Subsequently, a first insulating material layer 141' filling the first openings 151 may be formed. The first insulating material layer 141' may cover upper surfaces of the upper electrode lines 129' and a portion of an upper surface of the substrate 101 in the peripheral area PA.

Referring to FIGS. 8A to 8C, the first insulating material layer 141' may be planarized through a Chemical Mechanical Polishing (CMP) process such that the upper surfaces of the upper electrode lines 129' are exposed. In addition, a portion of the first insulating material layer 141' disposed in the peripheral area PA over the substrate 101 may be removed such that the portion of the upper surface of the substrate 101 in the peripheral area PA is exposed. Accordingly, the first insulating material layer 141' may remain to fill the first openings 151 in the cell area CA of the substrate 101. The first conductive line 111, the lower electrode line 121', the selection device line 123', the intermediate electrode line 125', the variable resistance line 127', the upper electrode line 129', and the first insulating material layer 141', may be defined as a stack structure ST formed in the cell area CA.

Referring to FIGS. 9A and 9B, an interlayer insulating pattern 143P may be formed over the substrate 101 in the peripheral area PA. The interlayer insulating pattern 143P may be formed to reduce or substantially eliminate a step difference between an upper surface of the stack structure ST formed in the cell area CA and an upper surface of the substrate 101 in the peripheral area PA.

The process of forming the interlayer insulating pattern 143P may include a process of forming an interlayer insulating layer (not shown) and a process of planarizing the interlayer insulating layer. The interlayer insulating layer may be deposited on in the peripheral area PA over the substrate 101 to have a height substantially equal to or higher than that of the stack structure ST formed in the cell area CA over the substrate 101, and cover the upper surface of the stack structure ST in the cell area CA. The process of planarizing the interlayer insulating layer may be performed such that the upper surface of the stack structure ST is exposed.

FIGS. 10A to 10C, second conductive lines 131 may be formed in the cell area CA over the substrate 101, and memory cells MC each having an island shape may be respectively formed at intersections of the second conductive lines 131 and the first conductive lines 111.

In order to form the second conductive lines 131 and the memory cells MC, after a second conductive layer (not shown) is formed in the cell area CA over the stack structure ST, the second conductive layer may be etched through an etching process using a plurality of mask patterns (not shown). For example, the plurality of mask patterns are formed over the second conductive layer such that the mask patterns each extend in a second direction II and adjacent mask patterns are spaced apart from each other by a given distance corresponding to a target distance between adjacent second conductive lines 131, thereby functioning as an etch barrier during the etching process. In addition, the first insulating material layer 141', the lower electrode lines 121', the selection device lines 123', the intermediate electrode lines 125', the variable resistance lines 127', and the upper electrode lines 129' may be etched using the mask patterns to form the first insulating patterns 141P, the lower electrodes 121, the selection device layers 123, the intermediate electrodes 125, the variable resistance layers 127, and the upper electrodes 129, respectively.

A portion of the second conductive layer (not shown) in the peripheral area PA over the substrate 101 may be removed through the etching process. Subsequently, the mask patterns (not shown) may be removed.

As a result, the second conductive lines 131 each extending in the second direction II may be formed, and the memory cells MC each including the lower electrode 121, the selection device layer 123, the intermediate electrode 125, the variable resistance layer 127, and the upper electrode 129 may have an island shape. In addition, second openings 153 may be defined in areas where portions of the second conductive layer (not shown), the first insulating material layer 141', the lower electrode layer 121', the selection device material layer 123', the intermediate electrode layer 125', the variable resistance material layer 127', and the upper electrode layer 129' are removed by the etching process.

Adjacent lower electrodes 121, adjacent selection device layers 123, adjacent intermediate electrodes 125, adjacent variable resistance layers 127, and adjacent upper electrodes 129 may be spaced apart from each other by a second opening 153. Accordingly, the memory cells MC each including the lower electrode 121, the selection device layer 123, the intermediate electrode 125, the variable resistance layer 127, and the upper electrode 129 may be formed at intersections of the first conductive lines 111 and the second conductive lines 131, respectively, and have an island shape. The first insulating material layer 141' penetrated by the second openings 153 may be separated into the first insulating patterns 141P under respective ones of the second conductive lines 131.

Subsequently, the second openings 153 may be filled with a second insulating layer (e.g., the second insulating layer 145 in FIGS. 6A to 6C).

Figure 11A:
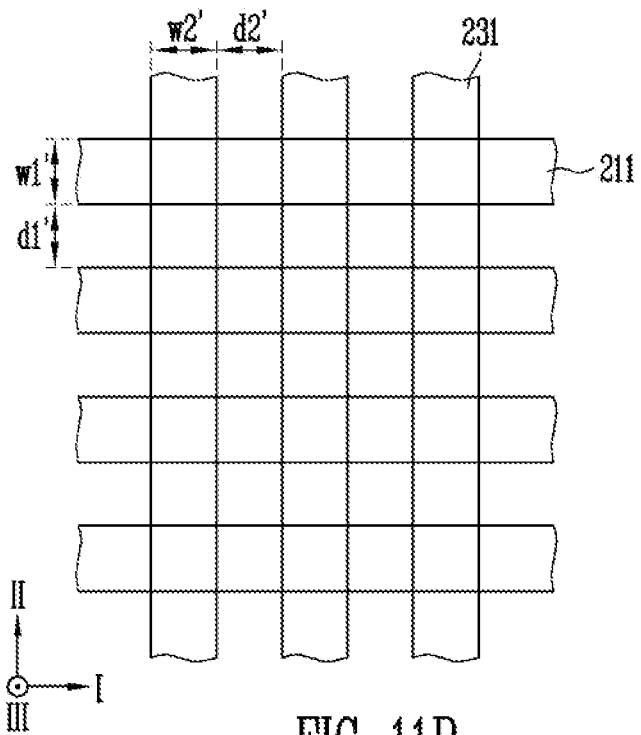
FIG. 11A is a first plan view of a memory cell array according to an embodiment of the present disclosure.
Figure 11B:
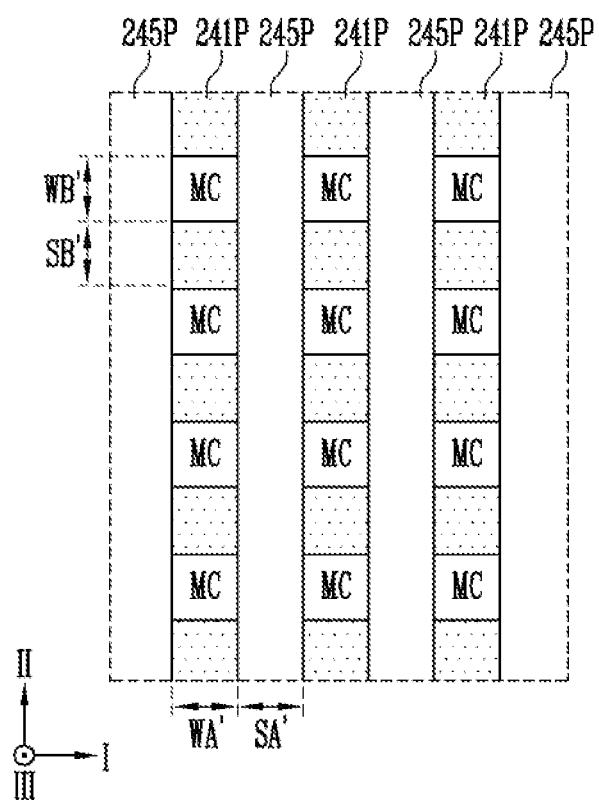
FIG. 11B is a second plan view of a memory cell array according to an embodiment of the present disclosure.

FIGS. 11A and 11B are plan views each illustrating a memory cell array according to an embodiment of the present disclosure.

FIG. 11A illustrates a layout of first conductive lines 211 and second conductive lines 231. The layout of the first conductive lines 211 and the second conductive lines 231 shown in FIG. 11A is a modification of the layout of the first conductive lines 111 and the second conductive lines 131 shown in FIG. 4. Detailed descriptions of some features similar to those described above with reference to FIG. 4 are omitted for the interest of brevity.

The first conductive lines 211 may be spaced apart from each other by a first distance d1' in a second direction II, and each of the first conductive lines 211 may have a first width w1' in the second direction II. The second conductive lines 231 may be spaced apart from each other by a second distance d2' in a first direction I that is substantially equal to the first distance d1', and each of the second conductive lines 231 may be formed to have a second width w2' in the first direction I that is substantially equal to the first width w1'.

FIG. 11B illustrates a layout of first insulating patterns 241P and second insulating patterns 245P. The layout of the first insulating patterns 241P and the second insulating patterns 245P shown in FIG. 11B is a modification of the layout of the first insulating pattern 141P and the second insulating patterns 145P shown in FIG. 4. Detailed descriptions of some features similar to those described above with reference to FIG. 4 are omitted for the interest of brevity.

Memory cells MC and the first insulating patterns 241P, which are arranged in the second direction II (or a column direction), are disposed between second insulating patterns 245P adjacent in the first direction I (or a row direction). These memory cells MC and first insulating patterns 241P arranged in the same column direction are alternately disposed in the second direction II.

A distance WA' between adjacent second insulating patterns 245P in the first direction I may be substantially equal to a distance WB' between adjacent first insulating patterns 241P in the second direction II. In other words, each of the memory cells MC may have a width in the first direction I substantially equal to that in the second direction II.

A width SB' of each of the first insulating patterns 241P in the second direction II may be substantially equal to that SA' of each of the second insulating patterns 245P in the first direction I. In other words, the memory cells MC may be spaced apart from each other by a first distance in the first direction I and by a second distance in the second direction II, the first distance being substantially equal to second distance. In the embodiment shown in FIG. 11B, because the thermal conductivity of the first insulating patterns 241P is lower than that of the second insulating patterns 245P, a thermal resistance between adjacent memory cells MC in the second direction II is greater than that between adjacent memory cells MC in the first direction I, thereby reducing the amount of heat transferred in the second direction II compared to that transferred in the first direction I. Accordingly, the embodiment shown in FIGS. 11A and 11B may be desirable when the effect of thermal disturbance between the adjacent memory cells MC in the second direction II needs to be reduced compared to that between the adjacent memory cells MC in the first direction I.

Figure 12:
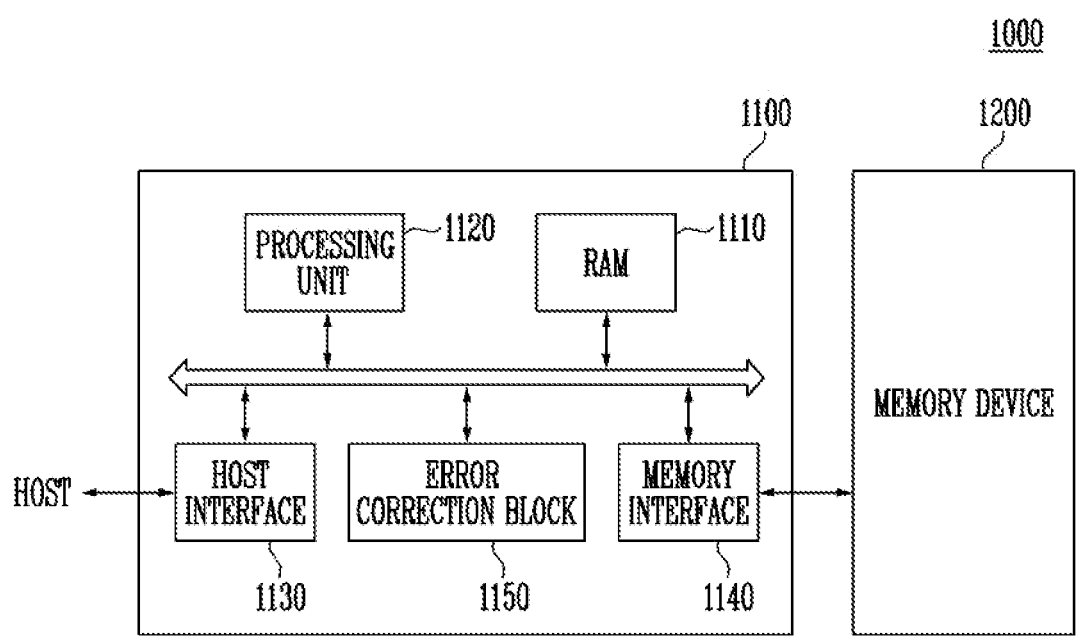
FIG. 12 illustrates a memory system according to an embodiment of the present disclosure.
Figure 13:
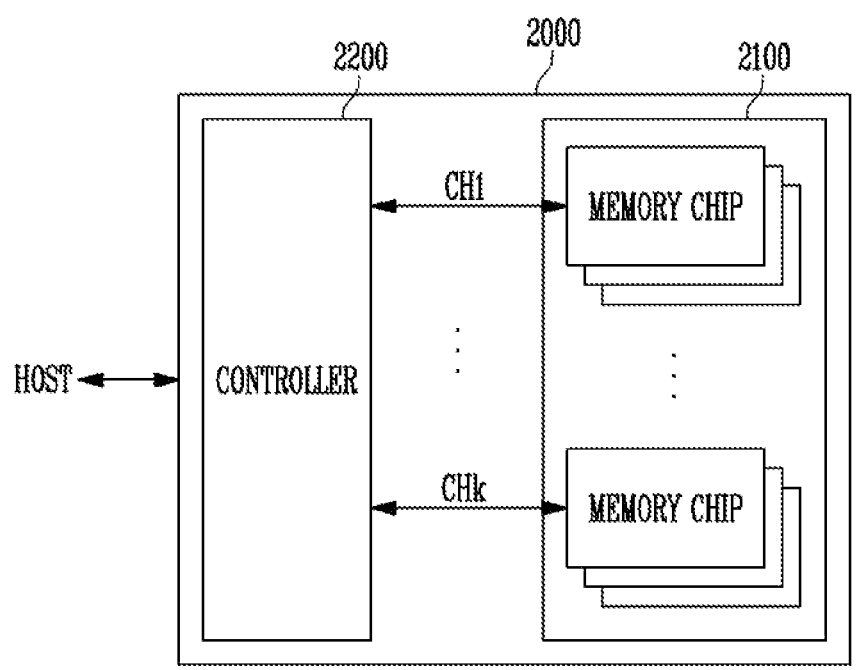
FIG. 13 illustrates a memory system according to another embodiment of the present disclosure.

FIGS. 12 and 13 are block diagrams illustrating memory systems according to embodiments of the present disclosure.

Referring to FIG. 12, the memory system 1000 includes a memory device 1200 and a controller 1100.

The controller 1100 is connected to a host and the memory device 1200. The controller 1100 accesses the memory device 1200 in response to a request from the host. For example, the controller 1100 controls a read operation, a program operation, and a background operation of the memory device 1200.

The controller 1100 provides an interface between the memory device 1200 and the host. The controller 1100 drives firmware for controlling the memory device 1200.

The controller 1100 includes a random access memory (RAM) 1110, a processing unit 1120, a host interface 1130, a memory interface 1140, and an error correction block 1150.

The RAM 1110 is used as at least one of a working memory of the processing unit 1120, a cache memory between the memory device 1200 and the host, and a buffer memory between the memory device 1200 and the host. The processing unit 1120 controls overall operations of the controller 1100. In addition, the controller 1100 may temporarily store program data provided from the host in a program operation.

The host interface 1130 includes a protocol for performing data exchange between the host and the controller 1100. The protocol may be one of protocols such as a Peripheral Component Interconnect (PCI) protocol, a Peripheral Component Interconnect-Express (PCI-E) protocol, an Advanced Technology Attachment (ATA) protocol, a Serial ATA (SATA) protocol, a Parallel ATA (PATA) protocol, a Small Computer Small Interface (SCSI) protocol, a serial Attached SCSI (SAS) protocol, a Universal Serial Bus (USB) protocol, a Multi-Media Card (MMC) protocol, an Enhanced Small Disk Interface (ESDI) protocol, and an Integrated Drive Electronics (IDE) protocol.

The memory interface 1140 interfaces with the memory device 1200. For example, the memory interface 1140 may include a NAND interface or a NOR interface.

The error correction block 1150 detects and corrects an error of data received from the memory device 1200 by using an error correction code (ECC). The processing unit 1120 may control the memory device 1200 to adjust a read voltage, based on an error detection result of the error correction block 1150, and to perform re-reading. In an exemplary embodiment, the error correction block 1150 may be provided as a component of the controller 1100.

The controller 1100 and the memory device 1200 may be integrated as one semiconductor device. In an exemplary embodiment, the controller 1100 and the memory device 1200 may be integrated as one semiconductor device, to constitute a memory card. For example, the controller 1100 and the memory device 1200 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the memory device 1200 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host connected to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the memory device 1200 or the memory system 1000 may be packaged in various forms. For example, the memory device 1200 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Referring to FIG. 13, the memory system 2000 includes a memory device 2100 and a controller 2200. The memory device 2100 includes a plurality of memory chips. The plurality of memory chips are divided into a plurality of groups.

The plurality of groups may communicate with the controller 2200 through first to kth channels CH1 to CHk. Each memory chip may be configured and operated identically to the memory device 1200 described with reference to FIG. 12.

Each group communicates with the controller 2200 through one common channel. The controller 2200 is configured identically to the controller 1100 described with reference to FIG. 12. The controller 2200 controls the plurality of memory chips of the memory device 2100 through the plurality of channels CH1 to CHk.

Figure 14:
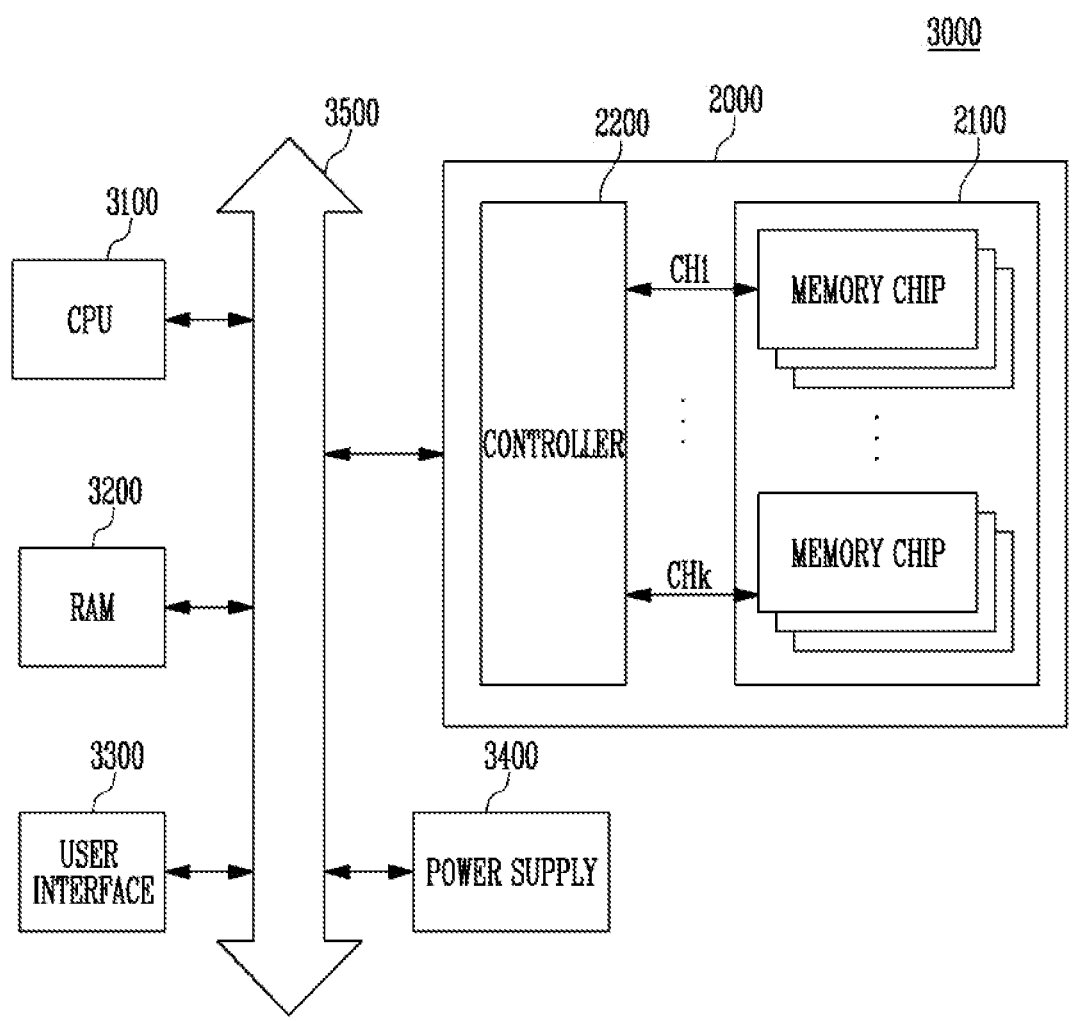
FIG. 14 illustrates a computing system according to an embodiment of the present disclosure.

FIG. 14 is a block diagram illustrating a computing system according to an embodiment of the present disclosure.

Referring to FIG. 14, the computing system 3000 includes a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data supplied through user interface 3300 or data processed by the central processing unit 3100 are stored in the memory system 2000.

A memory device 2100 is connected to the system bus 3500 through a controller 2200. Alternatively, the memory device 2100 may be directly connected to the system bus 3500. The function of the controller 2200 may be performed by the central processing unit 3100 and the RAM 3200.

FIG. 14 illustrates the computing system 3000 including the memory system 2000 described with reference to FIG. 13. However, the embodiment of the present disclosure is not limited thereto. For example, the memory system 2000 of the computing system 3000 may be replaced with the memory system 1000 described with reference to FIG. 12. In an exemplary embodiment, the computing system 3000 may include both the memory systems 1000 and 2000 described with reference to FIGS. 12 and 13.

According to embodiments of the present disclosure, one or more first insulating patterns between adjacent memory cells in a first lateral direction (e.g., the second direction II of FIG. 5B) are have a thermal conductivity lower than that of second insulating patterns between adjacent memory cells in a second lateral direction (e.g., the first direction I of FIG. 5B). As a result, when the adjacent memory cells MC in the first lateral direction are more susceptible to adverse effects due to thermal disturbance, these effects of the thermal disturbance between the adjacent memory cells in the first lateral direction may be reduced. Accordingly, the operation reliability of the memory cells may be improved.

Various embodiments of the present disclosure have been described above in the drawings and specification. However, embodiments of the present disclosure are not limited to the above-described embodiments and many variations are possible. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique.

What is claimed is:

1. A memory device, comprising:
a first memory cell disposed at an intersection of first and second conductive lines, the first and the second conductive lines extending in first and second directions, respectively;
a second memory cell spaced apart from the first memory cell by a first distance in the first direction;
a third memory cell spaced apart from the first memory cell by a second distance in the second direction;
a first insulating pattern disposed between the first memory cell and the second memory cell; and
a second insulating pattern disposed between the first memory cell and the third memory cell,
wherein the second insulating pattern, filling between the first memory cell and the third memory cell that are adjacent to each other in the second direction parallel to the second conductive line, has a lower thermal conductivity than the first insulating pattern extending in the second direction,
wherein the first insulating pattern includes a first oxide having a first carbon content, and the second insulating pattern includes a second oxide having a second carbon content, the second carbon content being higher than the first carbon content, and
wherein the first carbon content is in a range from about 15 wt % to about 20 wt %, and the second carbon content is in a range from about 20 wt % to about 25 wt %.

2. The memory device of claim 1, wherein the second memory cell has a first thermal resistance with respect to the first memory cell, and
wherein the third memory cell has a second thermal resistance with respect to the first memory cell, the second distance being shorter than the first distance, the second thermal resistance being equal to or greater than the first thermal resistance.

3. The memory device of claim 1, wherein the second and the third memory cells are provided adjacent to the first memory cell, and
wherein the second insulating pattern has a dielectric constant lower than that of the first insulating pattern.

4. The memory device of claim 1, wherein the second distance is shorter than the first distance.

5. The memory device of claim 1, wherein the second insulating pattern has a column shape, a longitudinal direction of the column shape being perpendicular to a plane defined by the first and second directions, and fills a space between a first sidewall of the first memory cell and a second sidewall of the third memory cell, the first sidewall and the second sidewall facing each other.

6. The memory device of claim 1, wherein the first memory cell, the second insulating pattern, and the third memory cell have substantially the same width in the first direction.

7. The memory device of claim 1, wherein the first insulating pattern extends in the second direction to cover sidewalls of the first memory cell, the second insulating pattern, and the third memory cell.

8. The memory device of claim 1, wherein each of the first memory cell, the second memory cell, and the third memory cell has a first width in the first direction and a second width in the second direction, the first width being wider than the second width.

9. The memory device of claim 1, wherein each of the first memory cell, the second memory cell, and the third memory cell includes a selection device layer and a variable resistance device layer.

10. A memory device, comprising:
a plurality of first conductive lines each extending in a first direction;
a plurality of second conductive lines each extending in a second direction;
a plurality of memory cells disposed at respective intersections of the plurality of first conductive lines and the plurality of second conductive lines;
a plurality of first insulating patterns each disposed between adjacent memory cells in the first direction; and
a plurality of second insulating patterns each disposed between adjacent memory cells in the second direction,
wherein the second insulating patterns, each filling between the adjacent memory cells in the second direction parallel to the second conductive line, have a lower thermal conductivity than the first insulating patterns extending in the second direction,
wherein each of the plurality of first insulating patterns includes a first oxide having a first carbon content, and each of the plurality of second insulating patterns includes a second oxide having a second carbon content, the second carbon content being higher than the first carbon content, and
wherein the first carbon content is in a range from about 15 wt % to about 20 wt %, and the second carbon content is in a range from about 20 wt % to about 25 wt %.

11. The memory device of claim 10, wherein the plurality of memory cells includes first, second, and third memory cells, the first memory cell and the second memory cell being spaced part from each other by a first distance in the first direction, the first memory cell and the third memory cell being spaced apart from each other by a second distance in the second direction, the second distance being shorter than the first distance, and wherein the second memory cell has a first thermal resistance with respect to the first memory cell, and the third memory cell has a second thermal resistance with respect to the first memory cell, the second thermal resistance being equal to or greater than the first thermal resistance.

12. The memory device of claim 10, wherein each of the second insulating patterns has a column shape, a longitudinal direction of the column shape being perpendicular to a plane defined by the first and second directions.

13. The memory device of claim 10, wherein each of the plurality of memory cells and each of the second insulating patterns have substantially the same width in the first direction.

14. The memory device of claim 10, wherein each of the first insulating patterns extends in the second direction to cover sidewalls of two or more memory cells arranged in the second direction.

15. An electronic device, comprising:
a memory device configured to store data; and
a controller configured to control an operation of the memory device in response to a request from a host,
wherein the memory device comprises:
a first memory cell;
a second memory cell being adjacent to the first memory cell and spaced apart from the first memory cell by a first distance in a first direction;
a third memory cell being adjacent to the first memory cell and spaced apart from the first memory cell by a second distance in a second direction crossing the first direction;
a first insulating pattern disposed between the first memory cell and the second memory cell; and
a second insulating pattern disposed between the first memory cell and the third memory cell, the second insulating pattern having a lower thermal conductivity than the first insulating pattern,
wherein the first insulating pattern includes a first oxide having a first carbon content and the second insulating pattern includes a second oxide having a second carbon content, the second carbon content being higher than the first carbon content, and wherein the first carbon content is in a range from about 15 wt % to about 20 wt %, and the second carbon content is in a range from about 20 wt % to about 25 wt %.

16. The electronic device of claim 15, wherein the second memory cell has a first thermal resistance with respect to the first memory cell, and
wherein the third memory cell has a second thermal resistance with respect to the first memory cell, the second distance being shorter than the first distance, the second thermal resistance being equal to or greater than the first thermal resistance.

* * * * *